(12) United States Patent
Zhou et al.

(10) Patent No.: US 11,210,561 B2
(45) Date of Patent: Dec. 28, 2021

(54) DEVICE AND METHOD FOR ELECTROMAGNETIC FIELD SIMULATION

(71) Applicant: FUJITSU LIMITED, Kawasaki (JP)

(72) Inventors: Rong Zhou, Beijing (CN); Liuan Wang, Beijing (CN); Jun Sun, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 106 days.

(21) Appl. No.: 16/718,720

(22) Filed: Dec. 18, 2019

(65) Prior Publication Data

US 2020/0193227 A1 Jun. 18, 2020

(30) Foreign Application Priority Data

Dec. 18, 2018 (CN) .......................... 201811553495.5

(51) Int. Cl.
*G06K 9/62* (2006.01)
*G06T 3/40* (2006.01)

(52) U.S. Cl.
CPC .......... *G06K 9/6256* (2013.01); *G06T 3/4046* (2013.01)

(58) Field of Classification Search
CPC .. G06K 9/00006–0012; G06K 9/00013; B60R 25/252; G06F 2203/0336; G05B 2219/24162; H04L 29/06809; H04L 63/0861; H04L 9/3231; H04N 21/4415
See application file for complete search history.

(56) References Cited

PUBLICATIONS

Extended European Search Report dated May 7, 2020 in related European Patent Application No. 19211347.0 (7 pages).
Ratner et al: "Neural network modelling of electromagnetic field problems"; Proceedings of International Workshop on Neural Networks for Identification, Control, Robotics and Signal/Image Processing, 1996, pp. 387-391, XP055689257, DOI: 10.1109/NICRSP. 1996.542782 ISBN: 978-08186-7456-3, section 3; (5 pages).
M. Luo et al. of School of Electronics and Information Engineering Sichuan University, Chengdu 610064, China; "*Prediction of the Electromagnetic Field in Metallic Enclosures using Artificial Neural Networks*"; Progress in Electromagnetics Research, vol. 116, 171-184, 2011; (14 pages).
Christian Ledig et al.; "*Photo-Realistic Single Image Super-Resolution Using a Generative Adversial Network*"; arXiv:1609. 04802v5 [cs.CV] May 25, 2017; (19 pages).

*Primary Examiner* — Mark Roz
(74) *Attorney, Agent, or Firm* — Staas & Halsey, LLP

(57) ABSTRACT

A device and a method for electromagnetic field simulation are provided. The image processing device is to obtain, with a first resolution, a first electromagnetic field simulation result of a simulation region, and to derive a second electromagnetic field simulation result with a second resolution, according to the first electromagnetic field simulation result, using a model trained based on a deep learning method. The second resolution is higher than the first resolution.

16 Claims, 10 Drawing Sheets

DEVICE AND METHOD FOR ELECTROMAGNETIC FIELD SIMULATION

CROSS-REFERENCE TO RELATED APPLICATIONS

This application is based on and hereby claims priority under 35 USC 119 to Chinese Patent Application No. 201811553495.5, filed on Dec. 18, 2018, in the China National Intellectual Property Administration, the entire contents of which are incorporated herein by reference.

FIELD

The present disclosure generally relates to the field of information processing, and more particularly to a device and a method for electromagnetic field simulation.

BACKGROUND

Electromagnetic field simulation is used to quantitatively describe electromagnetic waves propagating through objects and environments, to aid in the analysis of materials, in order to facilitate designing of, for example, antennas, radars, and circuits.

SUMMARY

An overview of the present disclosure is given hereinafter, to provide basic understanding regarding some aspects of the present disclosure. However, it should be understood that the overview is not an exhaustive overview of the present disclosure, and is not intended to determine a critical part or an important part of the present disclosure, or to limit the scope of the present disclosure. The overview is only intended to give some concepts of the present disclosure in a simplified way, as a preface of detailed description given later.

According to an embodiment, a device for electromagnetic field simulation is provided, which includes: an electromagnetic field simulation section and a resolution improvement section. The electromagnetic field simulation section is configured to obtain, with a first resolution, a first electromagnetic field simulation result of a simulation region. The resolution improvement section is configured to derive a second electromagnetic field simulation result with a second resolution, according to the first electromagnetic field simulation result, using a model trained based on a deep learning method, wherein the second resolution is higher than the first resolution. According to an aspect of an embodiment, a device which includes a processor to couple to a memory is provided to, obtain, with a first resolution, a first electromagnetic field simulation result of a simulation region; and derive a second electromagnetic field simulation result with a second resolution higher than the first resolution, according to the first electromagnetic field simulation result, using a model trained based on a deep learning method.

According to another embodiment, a method for electromagnetic field simulation is provided, which includes a step of obtaining, with a first resolution, a first electromagnetic field simulation result of a simulation region. The method further includes a step of deriving a second electromagnetic field simulation result with a second resolution, according to the first electromagnetic field simulation result, using a model trained based on a deep learning method, wherein the second resolution is higher than the first resolution.

According to another embodiment, a device for training a model for electromagnetic field simulation is provided, which includes a first simulation section, a second simulation section, and a model deriving section. The first simulation section is configured to obtain, with a first resolution, a first electromagnetic field simulation result of a simulation region. The second simulation section is configured to obtain, with a second resolution, a second electromagnetic field simulation result of the simulation region, wherein the second resolution is higher than the first resolution. The model deriving section is configured to derive the model, using the first electromagnetic field simulation result and the second electromagnetic field simulation result as training data, using a deep learning method.

According to another embodiment, a method for training a model for electromagnetic field simulation is provided, which includes a step of obtaining, with a first resolution, a first electromagnetic field simulation result of a simulation region. The method further includes a step of obtaining, with a second resolution, a second electromagnetic field simulation result of the simulation region, wherein the second resolution is higher than the first resolution. The method further includes a step of deriving the model, using the first electromagnetic field simulation result and the second electromagnetic field simulation result as training data, using a deep learning method.

According to the embodiments of the present disclosure, electromagnetic field simulations with high resolution are provided with a small amount of computation.

BRIEF DESCRIPTION OF THE DRAWINGS

The present disclosure may be better understood by referring to the following description given in conjunction with the accompanying drawings, in which same or similar reference numerals are used throughout the drawings to refer to the same or similar parts. The accompanying drawings, together with the following detailed description, are included in this specification and form a part of this specification, and are used to further illustrate preferred embodiments of the present disclosure and to explain the principles and advantages of the present disclosure. In the drawings.

DETAILED DESCRIPTION OF THE EMBODIMENTS

Figure 1:
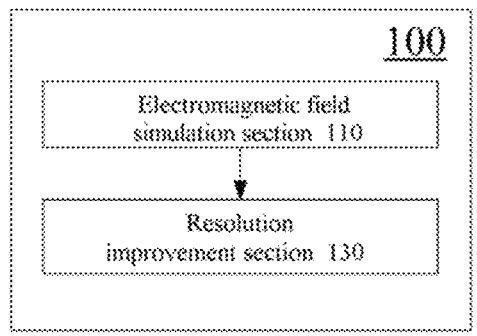
FIG. 1 is a block diagram showing a configuration example of a device for electromagnetic field simulation according to an embodiment of the present disclosure.

Embodiments of the present disclosure are described by referring to the drawings in the following. Elements and features described in one of the drawings or one embodiment of the present disclosure may be combined with elements and features as shown in one or more other drawings or embodiments. It should be noted that, for the purpose of clarity, indication and description of components and processing irrelevant to the present disclosure and known by those skilled in the art are omitted in the drawings and the explanation.

FIG. 1 shows a configuration example of a device 100 for electromagnetic field simulation according to an embodiment of the present disclosure. An image processing device may be implemented, for example, as a personal computer (such as a desktop computer, or a laptop computer), a workstation, a mobile terminal (such as a smart phone, a tablet computer, or a portable game terminal), a game machine, a television, or a video camera (such as a camera, or a monitor), or the like. However, embodiments of the present disclosure are not limited to the applications listed above, but can be applied to any device capable of information processing.

As shown in FIG. 1, the device 100 for electromagnetic field simulation includes: an electromagnetic field simulation section 110 and a resolution improvement section 130.

The electromagnetic field simulation section 110 is configured to obtain, with a first resolution, a first electromagnetic field simulation result of a simulation region.

According to an embodiment, the electromagnetic field simulation section 110 is configured to obtain the first electromagnetic field simulation result using a finite difference time domain (FDTD) method.

In particular, the electromagnetic field simulation section 110 may be configured to calculate the first electromagnetic field simulation result based at least on an electromagnetic wave propagation frequency range in the simulation region, geometric parameters and material parameters of the simulation region, and mesh size.

Here, a brief description of the FDTD method is given. FDTD is an electromagnetic field simulation method contributing mainly to a discretization method for Maxwell's equations. With the method, an electric field and a magnetic field are evenly and alternately distributed in space and time, and difference is used to replace differential to derive a recursive equation for numerical calculation. In space, a magnetic field at a current mesh position is calculated using an electric field at a surrounding mesh position, and an electric field at the current mesh position is calculated using a magnetic field at a surrounding mesh position. In the time dimension, the field strength at a current moment is used to recur a field strength at a next moment.

The significance of the electromagnetic field simulation result lies not only in obtaining the electromagnetic field distribution at a certain time, but also in the variation of electromagnetic field on each spatial mesh in the whole simulation time period, so it can includes four-dimensional information (three-dimensional space information and one-dimensional time information). Based on this time domain simulation result, for example, frequency components of the electromagnetic field at each space point can be calculated by Fourier transform.

Generally, a three-dimensional FDTD simulation can be performed. In the case of some specific simpler material distributions, it can be simplified to a two-dimensional FDTD simulation, or even a one-dimensional FDTD simulation. In the embodiments of the present disclosure, a one-dimensional electromagnetic field simulation environment is taken as an example for illustration, and a high-dimensional simulation result can be obtained by combining low-dimensional simulation results.

Figure 9:
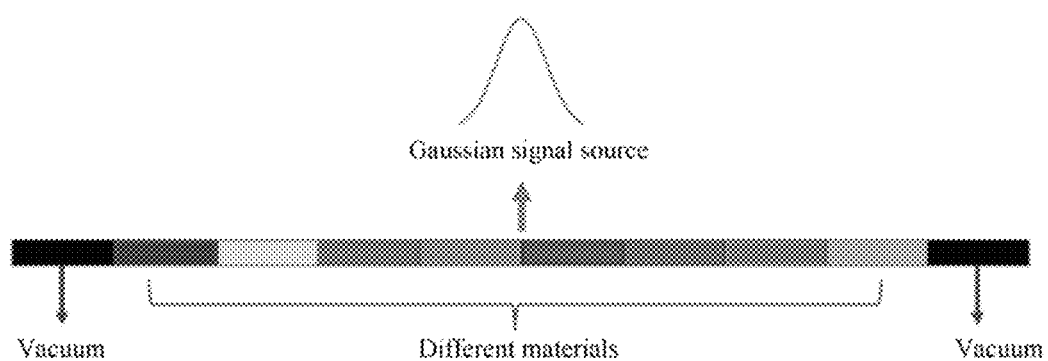
FIG. 9 is a schematic diagram explaining a one-dimensional electromagnetic field simulation environment.

FIG. 9 shows an example environment of a one-dimensional electromagnetic field simulation, which includes different materials, and the material of each segment is randomly generated. A time varying electric field is arranged at a central position and functions as a signal source (such as, a Gaussian signal).

The recursive equations for the one-dimensional FDTD simulation are as follows:

$$\tilde{H}_x^k \mid_{t+\frac{\Delta t}{2}} = \tilde{H}_x^k \mid_{t-\frac{\Delta t}{2}} + \frac{c_0}{\mu_{xx}^k} \frac{\Delta t}{\Delta z}(E_y^{k+1} \mid_t - E_y^k \mid_t), \text{ and}$$

$$E_y^k \mid_{t+\Delta t} = E_y^k \mid_t + \frac{c_0}{\varepsilon_{yy}^k} \frac{\Delta t}{\Delta z}\left(\tilde{H}_x^k \mid_{t+\frac{\Delta t}{2}} = \tilde{H}_x^k \mid_{t+\frac{\Delta t}{2}}\right).$$

In the above equations, $H_x$ represents a magnetic field, $E_y$ represents an electric field, $\Delta t$ represents a time step, $\Delta z$ represents a space step which is a mesh size. A space rectangular coordinate system can be imagined, in which an electromagnetic wave propagates in the positive direction of a z-axis, the magnetic field at each point on the z-axis has a direction that is parallel to an x-axis and directs to the positive direction of the x-axis, and has an intensity $H_x$, the electric field at each point on the z-axis has a direction that is parallel to a y-axis and directs to the positive direction of the y-axis, and has an intensity $E_y$. t represents a coordinate on a time axis, k represents a space mesh coordinate (that is, the coordinate on the z-axis), $c_0$ represents the speed of light in vacuum, $\mu_{xx}^k$ and $\varepsilon_{yy}^k$ are related to the material, and respectively represent the magnetic permeability and the dielectric constant of the material. Since different physical materials are placed at different space positions, $\mu_{xx}^k$ and $\varepsilon_{yy}^k$ are also related to the space position k.

It can be seen from the above two equations that the electric field and the magnetic field are alternately distributed in time, and the electric field exists at a moment of an integer multiple of $\Delta t$, the magnetic field exists at a moment of an integer multiple of Δt added half Δt. In fact, the electric field and the magnetic field are alternately distributed in space, and are spaced by a distance of half a mesh from each other, that is, a distance of half Δz. It should be noted that only a discretization method for simulation calculations is described above, and electric fields and magnetic fields can be considered to be continuously distributed in real physical world.

Figure 10:
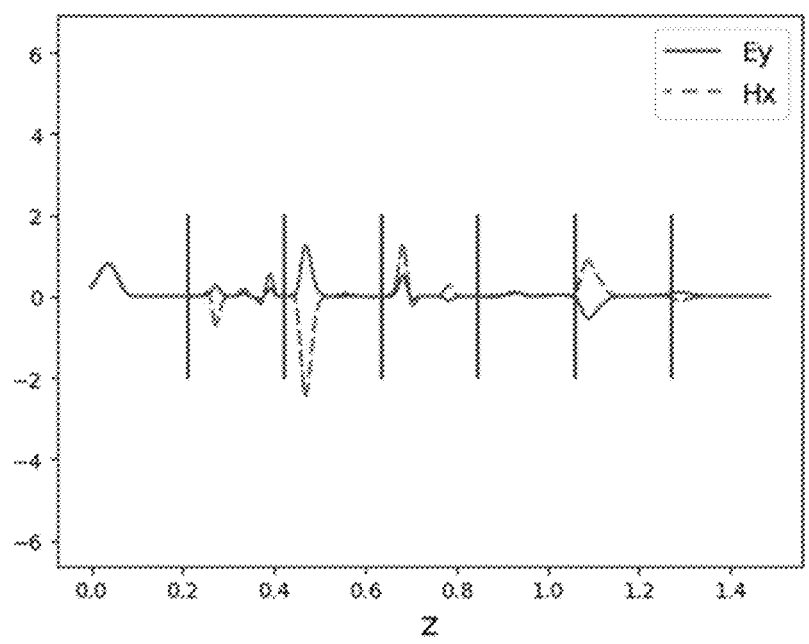
FIG. 10 shows a space distribution of electric field and magnetic field at a certain moment in one-dimensional electromagnetic field simulation.

The one-dimensional electromagnetic field FDTD simulation result is electric field and magnetic field waveforms varying with time, and an example of the waveforms at a certain moment is shown in FIG. 10, in which the vertical lines indicate the edges between different materials.

It should be noted that the embodiments of the present disclosure are applicable not only to FDTD but also to other numerical methods for approximate calculation of electromagnetic fields, such as the finite element method (FEM), the finite integration method in time domain (FITD), the method of moment (MoM), the transmission line method (TLM), and the line method (ML), etc.

For example, in the electromagnetic field simulation calculation using FDTD, computation cost increases significantly with the increase of cell numbers (that is, from coarse meshes to fine meshes). However, the mesh resolution is required to be set fine enough to get accurate FDTD results, resulting in longer computation time.

Referring to FIG. 1, the resolution improvement section 130 is configured to derive a second electromagnetic field simulation result with a second resolution, according to the first electromagnetic field simulation result obtained by the electromagnetic field simulation section 110, using a model trained based on a deep learning method, wherein the second resolution is higher than the first resolution.

The case where the electromagnetic field simulation section 110 employs the FDTD method is stilled used as an example, and the method can be used to generate training data required for deep learning. According to the present disclosure, super-resolution reconstruction is applied to FDTD simulation, and each training sample includes a low-precision FDTD simulation result and a corresponding high-precision FDTD simulation result. The low-precision FDTD simulation result corresponds to a low-resolution image (LR) inputted when performing image super-resolution reconstruction, and the high-precision FDTD simulation result corresponds to a high-resolution image (HR) inputted when performing image super-resolution reconstruction.

According to an embodiment, the deep learning method may include a method based on a convolutional neural network, such as a super-resolution generative adversarial network (SRGAN).

The mapping from low precision to high precision is realized by a neural network, that is, a prediction result (corresponding to a super-resolution image, SR, generated in the image super-resolution reconstruction) obtained by processing the low-precision simulation result using the neural network is close enough to a real high-precision simulation result.

Figure 11:
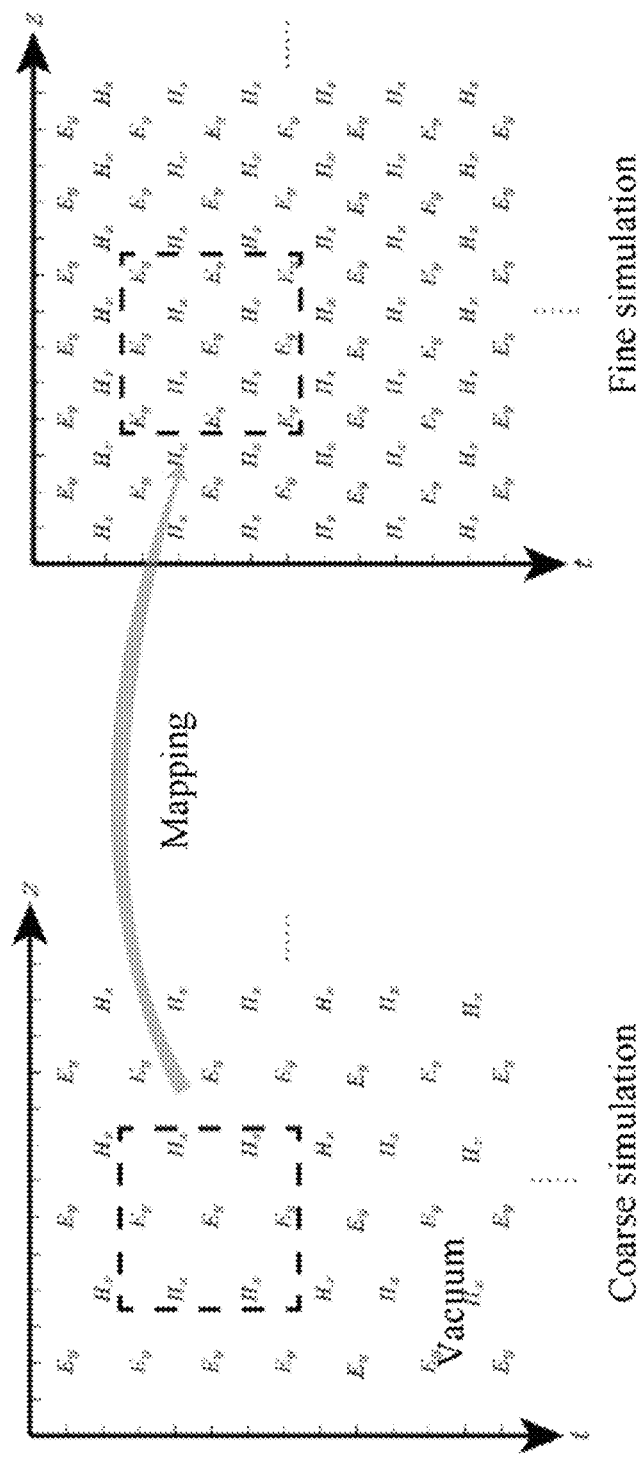
FIG. 11 is a schematic diagram explaining an electromagnetic simulation mapping.

The one-dimensional FDTD simulation is still taken as an example for illustration. Simulation is performed using time domain data generated by FDTD, where the time domain data generated by one-dimensional FDTD simulation forms a two-dimensional array, as shown in FIG. 11, in which the horizontal axis represents space z and the vertical axis represents time t. Based on the physical properties of an electromagnetic field, an electric field and a magnetic field are continuously distributed in space, and a time-varying electric field generates a magnetic field, while a time-varying magnetic field generates an electric field. The electric field distribution and the magnetic field distribution in space and time are discretely calculated using the FDTD algorithm based on difference approximation. Based on the idea of Yee mesh, the electric and magnetic fields at positions where the electric and magnetic fields are alternately distributed in space and time are calculated using the FDTD method. A finer space mesh and a finer time mesh correspond to a more accurate result obtained by the FDTD method.

Since the electric field and the magnetic field interact with each other in space and time and cannot be separated, it is more reasonable to learn the electric field and the magnetic field together instead of dividing them apart. Furthermore, the value of the electric field component or magnetic field component at a point in space and time is related to the electric field and magnetic field in adjacent space and time. If there is a mapping relationship between the low-precision and the high-precision at the corresponding the local location of time and space (such as the areas included in the blocks shown in FIG. 11), it is desirable to learn such mapping by the neural network.

As mentioned above, the electromagnetic field simulation result may include four-dimensional information, which may be decomposed into lower-dimensional data for processing to reduce computation costs.

According to an embodiment, the first electromagnetic field simulation result and the second electromagnetic field simulation result may include a four-dimensional data set, and the resolution improvement section 130 may be configured to convert the first electromagnetic field simulation result into the second electromagnetic field simulation result by: decomposing the four-dimensional data set into multiple two-dimensional data sets; for each of the multiple two-dimensional data sets, improving a resolution of the two-dimensional data set using the model; and combining the multiple two-dimensional data sets whose resolutions have been improved into a four-dimensional data set, as the second electromagnetic field simulation result.

As mentioned above, the deep learning method in the embodiments of the present disclosure may include an SRGAN method.

Figure 12:
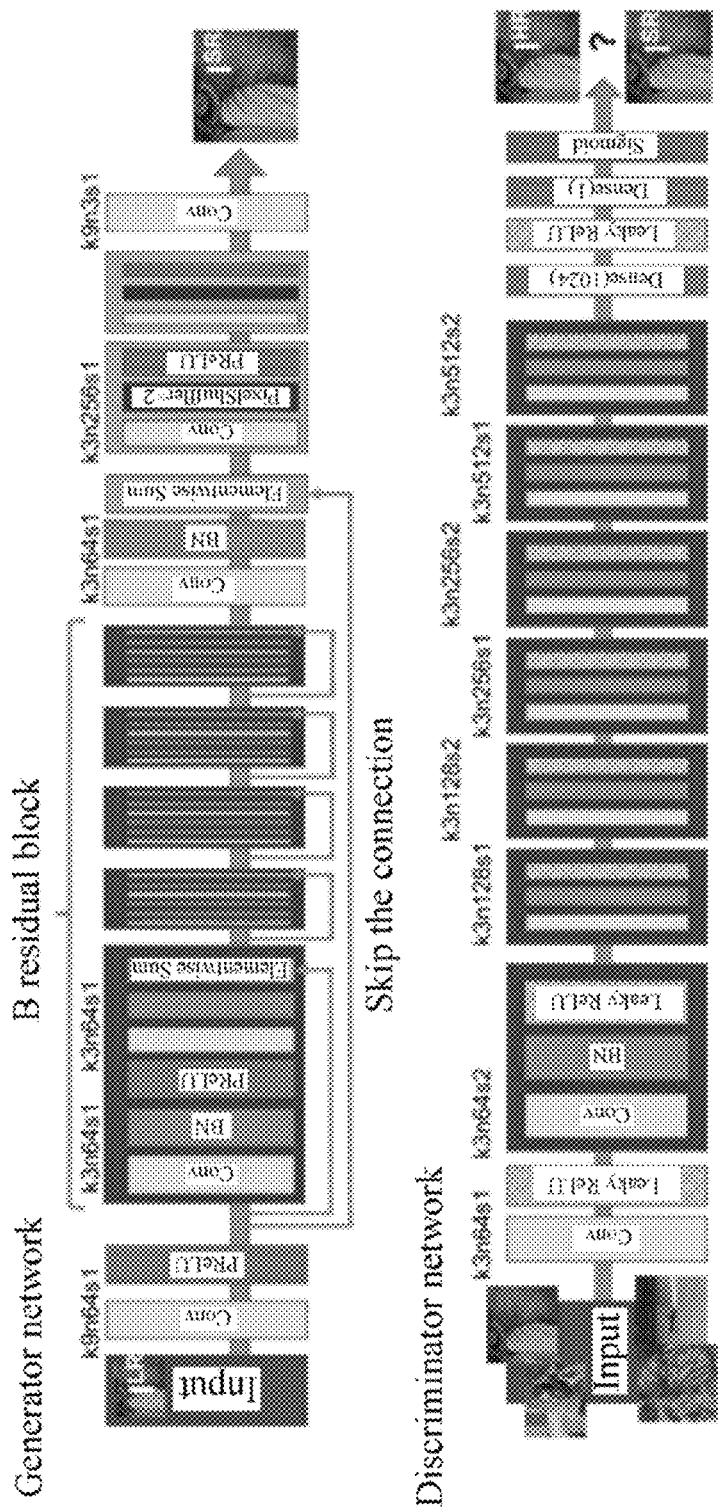
FIG. 12 is a schematic structural diagram of a super-resolution generative adversarial network (SRGAN) adopted in an embodiment.

Reference is made to FIG. 12, which shows a network structure of an SRGAN applied to image super-resolution reconstruction. A generator in the network increases the resolution of an inputted image by two times in both the length and width dimensions. A discriminator is used to determine whether the super resolution image generated by the generator is close enough to a real high-resolution image. An original loss function of the SRGAN includes three parts:

$$l^{SR} = l_{MSE}^{SR} + l_{VGG}^{SR} + l_{Gen}^{SR},$$

wherein, $l_{MSE}^{SR}$ represents a mean square deviation of an SR and an HR corresponding to the SR, $l_{VGG}^{SR}$ represents a mean square deviation of features of the SR and HR, extracted by a pre-trained VGG19 network, and $l_{Gen}^{SR}$ represents an adversarial loss, that is, a loss of the discriminator, indicating the probability that the SR is the HR.

Regarding electromagnetic simulation, since electromagnetic simulation data and optical image data have different data distributions, there is no shared feature between them. In addition, the electromagnetic simulation data requires a similarity between data in a one-to-one correspondence, rather than a similarity based on a visual effect in image. Therefore, for electromagnetic field simulation, a high-order visual feature extracted by the pre-trained VGG19 network may not be used. Correspondingly, $l_{VGG}^{SR}$ may be removed, that is, the following loss function may be used for the super-resolution reconstruction of the electromagnetic field simulation result:

$$l^{SR}=l_{MSE}^{SR}+l_{Gen}^{SR}.$$

In the above embodiments, the model trained based on the deep learning method, may be acquired from other devices. Furthermore, the model may be acquired using a device for electromagnetic field simulation according to an embodiment.

Figure 2:
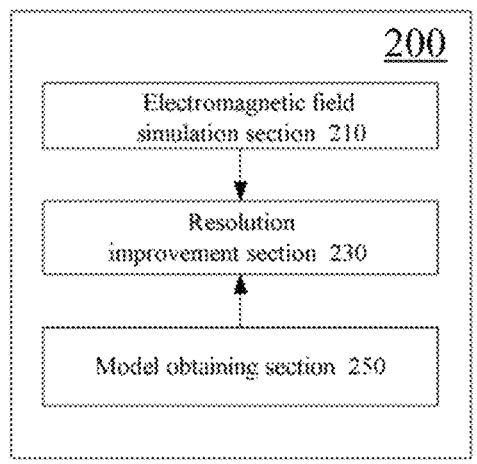
FIG. 2 is a block diagram showing a configuration example of a device for electromagnetic field simulation according to another embodiment.

As shown in FIG. 2, a device 200 for electromagnetic field simulation according to an embodiment includes: an electromagnetic field simulation section 210, a resolution improvement section 230, and a model obtaining section 250. The functional configurations of the electromagnetic field simulation section 210 and the resolution improvement section 230 are similar to the electromagnetic field simulation section 110 and the resolution improvement section 130 described above with reference to FIG. 1.

The model obtaining section 250 is configured to obtain the model used by the resolution improvement section 230, by: using the first electromagnetic field simulation result and the second electromagnetic field simulation result as training data, respectively; and deriving the model based on the training data using the deep learning method.

In an embodiment, the model obtaining section 250 is configured to obtain an electromagnetic field simulation result of a simulation region as training data, using an FDTD method, based on a first mesh size corresponding to a first resolution and a second mesh size corresponding to a second resolution, respectively.

In addition, in a case that the deep learning method includes a SRGAN method, the model obtaining section 250 is configured to obtain a generator network and a discriminator network of the SRGAN using the training data, and use the generator network as the model.

The deep learning model may cause a large computation cost. However, the learning process of the model may be performed off-line (such as the process example shown in FIG. 14). In a case that the model has been obtained, the on-line testing process of a new instance (such as the process example shown in FIG. 15) is faster.

Figure 14:
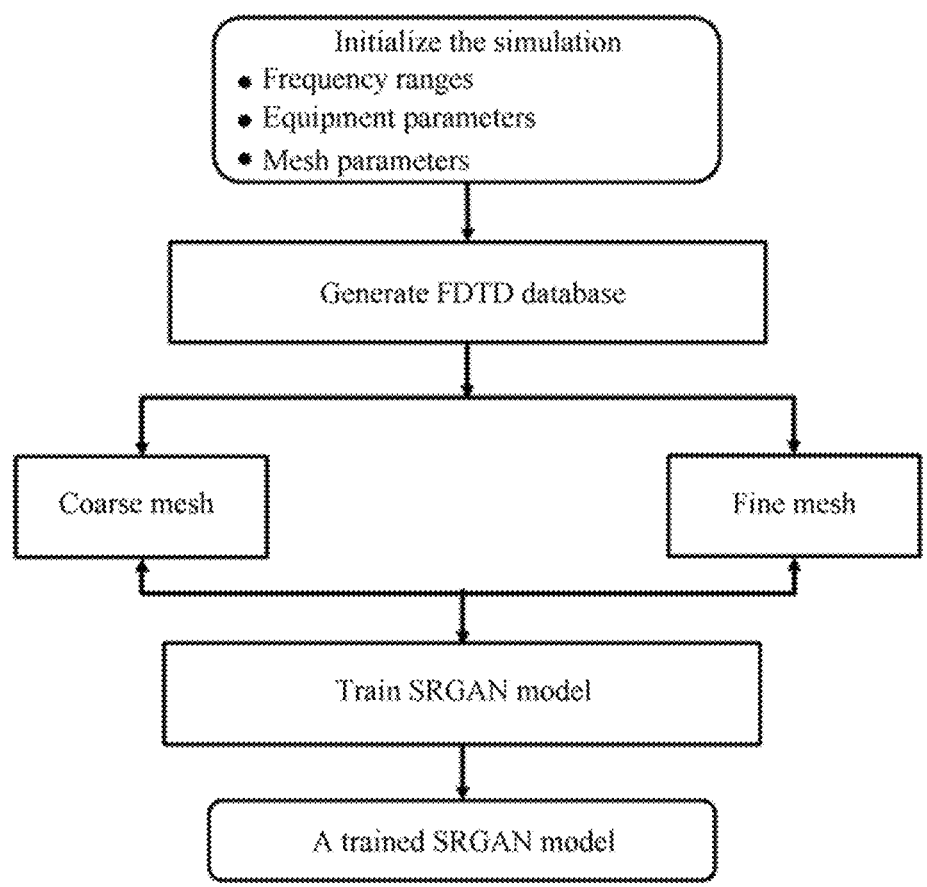
FIG. 14 is a flow chart explaining a model training process according to an example embodiment.

In the training process shown in FIG. 14, simulation parameters are first initialized, the parameters include, for example, frequency ranges, equipment parameters, and mesh parameters. The equipment parameters may include geometric parameters and material parameters (such as conductivities and dielectric constants at different space positions). The mesh parameters may include a coarse mesh resolution and a coarse time resolution, and a fine mesh resolution and a fine time resolution.

Next, a FDTD database is generated, that is, FDTD simulation is performed with a coarse resolution and a fine resolution.

Then, the coarse mesh simulation result and the fine mesh simulation result are used as training data to train an SRGAN model.

Figure 16:
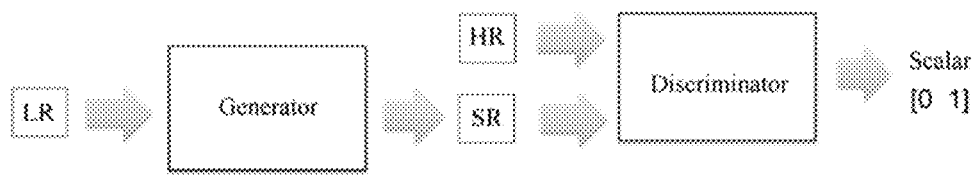
FIG. 16 is a schematic diagram explaining a resolution enhancement processing according to an example embodiment.

In an embodiment, as shown in FIG. 16, the data contained in an SRGAN framework includes: a low-resolution simulation result (LR), a super-resolution simulation result (SR) obtained by executing a generator GAN, and a high-resolution simulation result (HR) as a groundtruth obtained by performing a fine mesh FDTD simulation.

Figure 15:
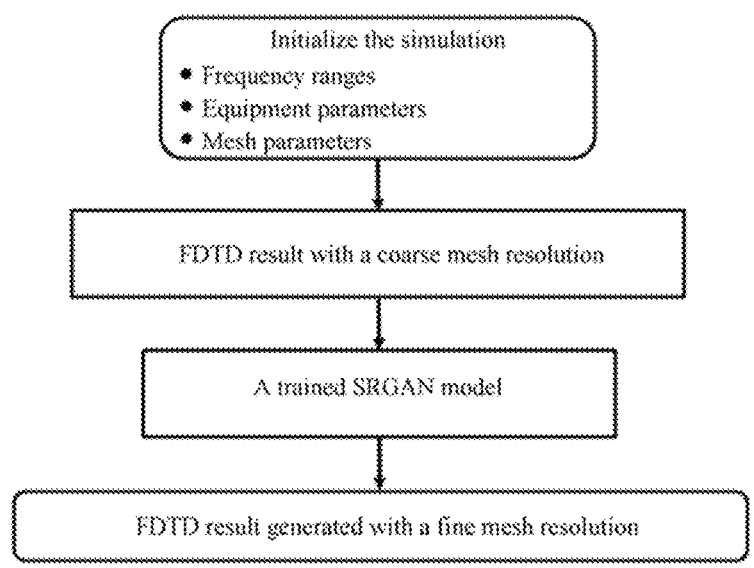
FIG. 15 is a flow chart explaining a model testing process according to an example embodiment.

In the test procedure shown in FIG. 15, simulation parameters are first initialized, which is similar to the initialization process described above.

Next, FDTD data with a coarse mesh resolution is generated.

Then, an FDTD result with a super-resolution that is, a fine mesh resolution, is generated using an SRGAN model.

In the above embodiment, the first resolution of the electromagnetic field simulation result is improved to a second resolution. While various resolution improvements can be flexibly performed according to embodiments of the present disclosure. That is, low resolution simulation results at different levels can be improved to high resolution simulation results at different levels as required.

According to an embodiment, a model for resolution improvement may include multiple models, the multiple models are used for mapping between multiple first resolutions and multiple second resolutions, respectively. These modes may be obtained based on training images with different resolutions.

In the above embodiment, by performing electromagnetic field simulation at a low resolution (the first electromagnetic field simulation result) and improving the resolution of the electromagnetic field simulation result using a model obtained by learning, a high-precision electromagnetic field simulation result can be obtained at a low calculation cost.

Figure 13:
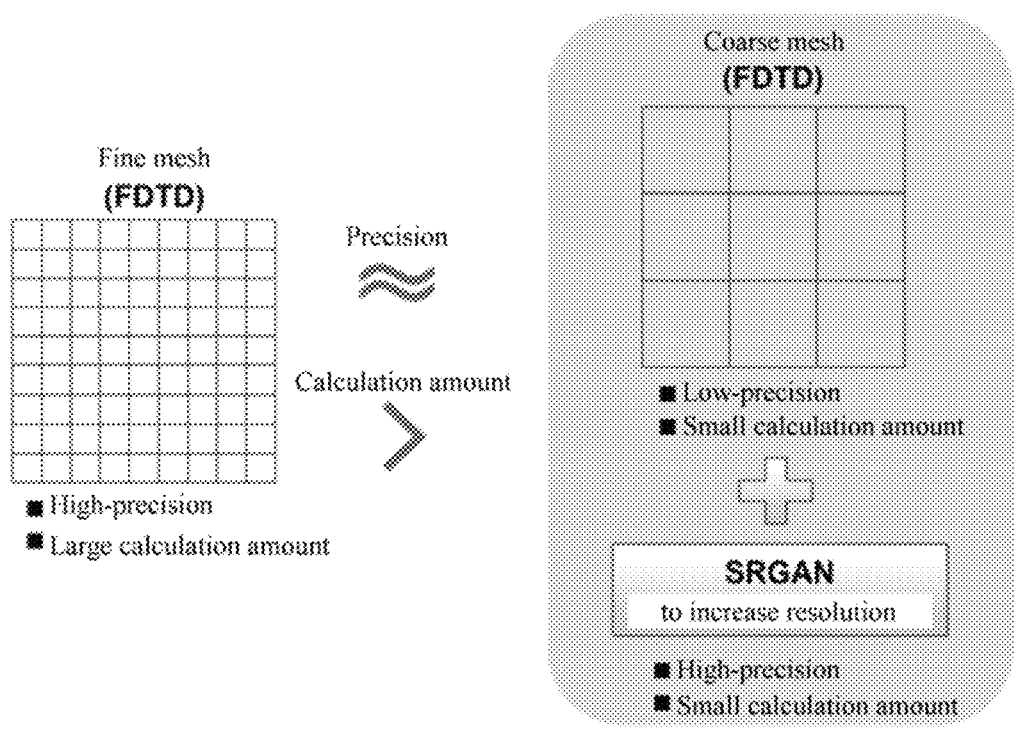
FIG. 13 is a schematic diagram explaining a frame of an example embodiment.

As shown in FIG. 13, compared with a fine mesh FDTD simulation, by performing a coarse mesh FDTD simulation and improving the resolution of the simulation result by the SRGAN model, an similar electromagnetic field simulation precision can be obtained with a small amount of calculation.

According to an embodiment of the present disclosure, a method for electromagnetic field simulation is further provided.

Figure 3:
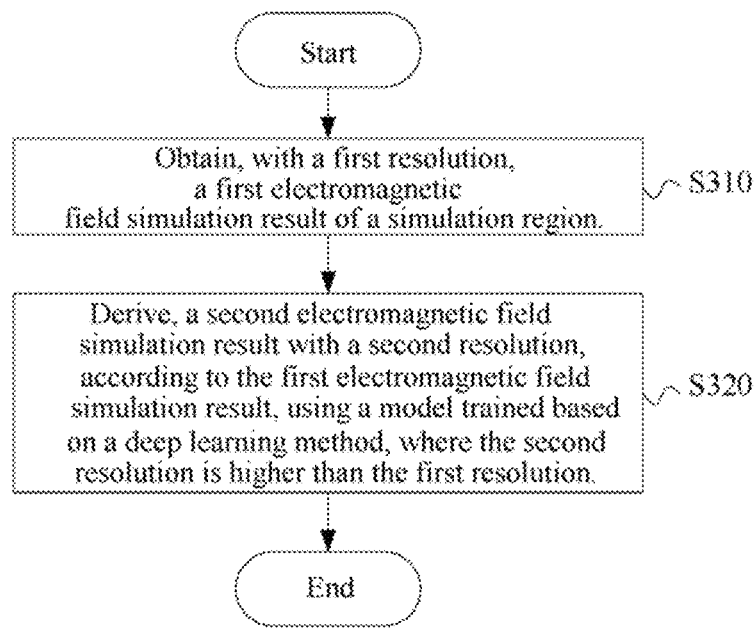
FIG. 3 is a flow chart showing a process example of a method for electromagnetic field simulation according to an embodiment of the present disclosure.

As shown in FIG. 3, a method for electromagnetic field simulation according to an embodiment includes the following steps S310 and S320.

In step S310, a first electromagnetic field simulation result of a simulation region is obtained with a first resolution.

The first electromagnetic field simulation result may be obtained by a finite difference time domain (FDTD) method.

The first electromagnetic field simulation result may be calculated based at least on an electromagnetic wave propagation frequency range in a simulation region, geometric parameters and material parameters of the simulation region, and mesh size.

In step S320, a second electromagnetic field simulation result with a second resolution is derived according to the first electromagnetic field simulation result, using a model trained based on a deep learning method, wherein the second resolution is higher than the first resolution.

The deep learning method may include a method based on a convolutional neural network, such as a super-resolution generative adversarial network (SRGAN).

The model may be obtained by: using the first electromagnetic field simulation result and the second electromagnetic field simulation result as training data, respectively; and deriving the model based on the training data using the deep learning method.

In particular, an electromagnetic field simulation result of a simulation region may be obtained as training data using an FDTD method, based on a first mesh size corresponding to a first resolution and a second mesh size corresponding to a second resolution, respectively.

A generator network and a discriminator network of the SRGAN may be obtained using the training data, and the generator network is used as the model.

The first electromagnetic field simulation result and the second electromagnetic field simulation result may include a four-dimensional data set, and the first electromagnetic field simulation result may be converted into the second electromagnetic field simulation result by following process: decomposing the four-dimensional data set into multiple two-dimensional data sets; for each of the multiple two-dimensional data sets, improving a resolution of the two-dimensional data set using the model; and combining the multiple two-dimensional data sets whose resolutions have been improved into a four-dimensional data set, as the second electromagnetic field simulation result.

Furthermore, the model may include multiple models for mapping between multiple first resolutions and/or multiple second resolutions, respectively.

According to an embodiment of the present disclosure, a device and a method for training a model for electromagnetic field simulation are further provided.

Figure 4:
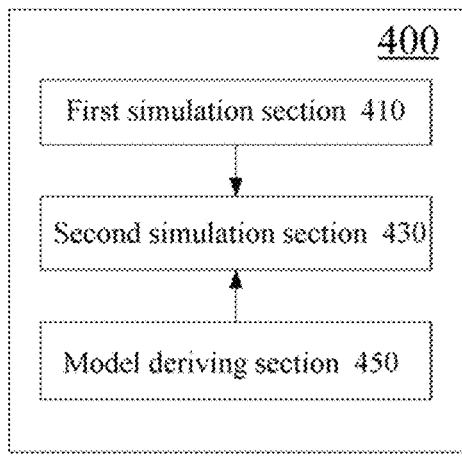
FIG. 4 is a block diagram showing a configuration example of a device for training a model for electromagnetic field simulation according to an embodiment of the present disclosure.

As shown in FIG. 4, the device 400 for training a model for electromagnetic field simulation includes a first simulation section 410, a second simulation section 430, and a model deriving section 450.

The first simulation section 410 is configured to obtain, with a first resolution, a first electromagnetic field simulation result of a simulation region.

The second simulation section 430 is configured to obtain, with a second resolution, a second electromagnetic field simulation result of the simulation region, wherein the second resolution is higher than the first resolution.

The model deriving section 450 is configured to derive the model, using the first electromagnetic field simulation result and the second electromagnetic field simulation result as training data, using a deep learning method.

Figure 5:
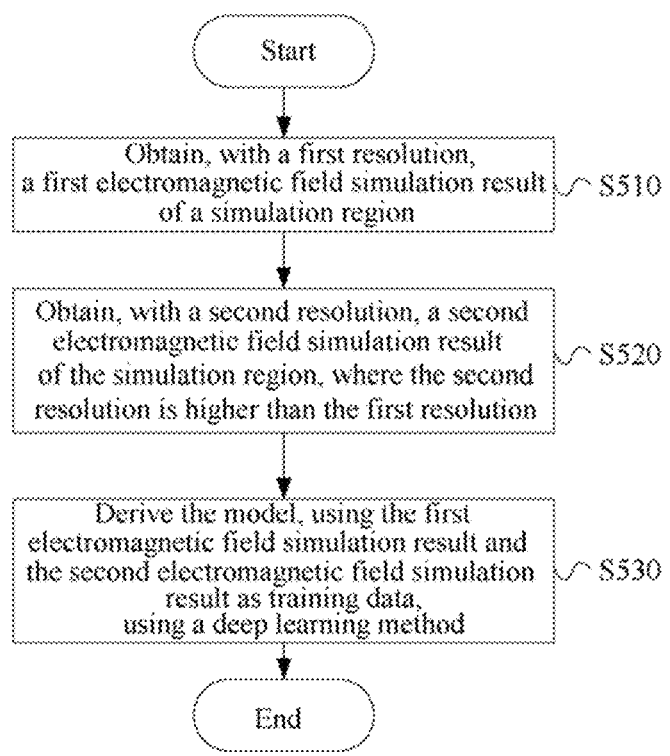
FIG. 5 is a flow chart showing a process example of a method for training a model for electromagnetic field simulation according to an embodiment of the present disclosure.

As shown in FIG. 5, the method for training a model for electromagnetic field simulation includes the following steps S510, S520 and S530.

In step S510, a first electromagnetic field simulation result of a simulation region is obtained with a first resolution.

In step S520, a second electromagnetic field simulation result of the simulation region is obtained with a second resolution, wherein the second resolution is higher than the first resolution.

In step S530, the model is derived using the first electromagnetic field simulation result and the second electromagnetic field simulation result as training data, using a deep learning method.

Figure 6:
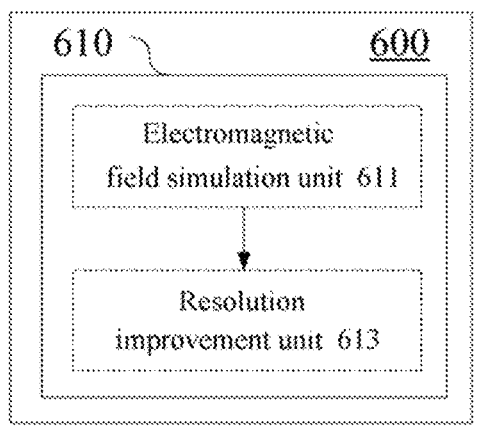
FIG. 6 is a block diagram showing a configuration example of a device for electromagnetic field simulation according to an embodiment of the present disclosure.

FIG. 6 shows a configuration example of a device for electromagnetic field simulation according to an embodiment. As shown in FIG. 6, the device 600 for electromagnetic field simulation according to this embodiment includes a processing circuit 610. The processing circuit 610 may be implemented, for example, as a specific chip, a chipset, or a central processing unit (CPU), etc. The processing circuit 610 includes an electromagnetic field simulation unit 611 and a resolution improvement unit 613.

The electromagnetic field simulation unit 611 is configured to obtain, with a first resolution, a first electromagnetic field simulation result of a simulation region.

The resolution improvement unit 613 is configured to derive a second electromagnetic field simulation result with a second resolution, according to the first electromagnetic field simulation result obtained by the electromagnetic field simulation unit 611, using a model trained based on a deep learning method, wherein the second resolution is higher than the first resolution.

Figure 7:
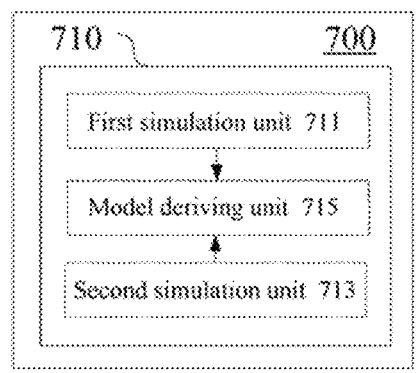
FIG. 7 is a block diagram showing a configuration example of a device for training a model for electromagnetic field simulation according to an embodiment of the present disclosure.

FIG. 7 shows a configuration example of a device for training a model for electromagnetic field simulation according to an embodiment. As shown in FIG. 7, the device 700 for training a model for electromagnetic field simulation according to this embodiment includes a processing circuit 710. The processing circuit 710 may be implemented, for example, as a specific chip, a chipset, or a central processing unit (CPU), etc. The processing circuit 710 includes a first simulation unit 711, a second simulation unit 713, and a model deriving unit 715.

The first simulation unit 711 is configured to obtain, with a first resolution, a first electromagnetic field simulation result of a simulation region.

The second simulation unit 713 is configured to obtain, with a second resolution, a second electromagnetic field simulation result of the simulation region, wherein the second resolution is higher than the first resolution.

The model deriving unit 715 is configured to derive the model, using the first electromagnetic field simulation result and the second electromagnetic field simulation result as training data, using a deep learning method.

As an example, the various steps of the above methods, as well as the various constituent modules and/or units of the above device, may be implemented as software, firmware, hardware, or a combination thereof. In a case of implementation as software or firmware, a program, for implementing a software of the above method, can be installed to a computer with a dedicated hardware structure (such as a general computer 800 shown in FIG. 8), from a storage medium or a network. The computer is capable of performing various functions when various programs are installed on the computer.

Figure 8:
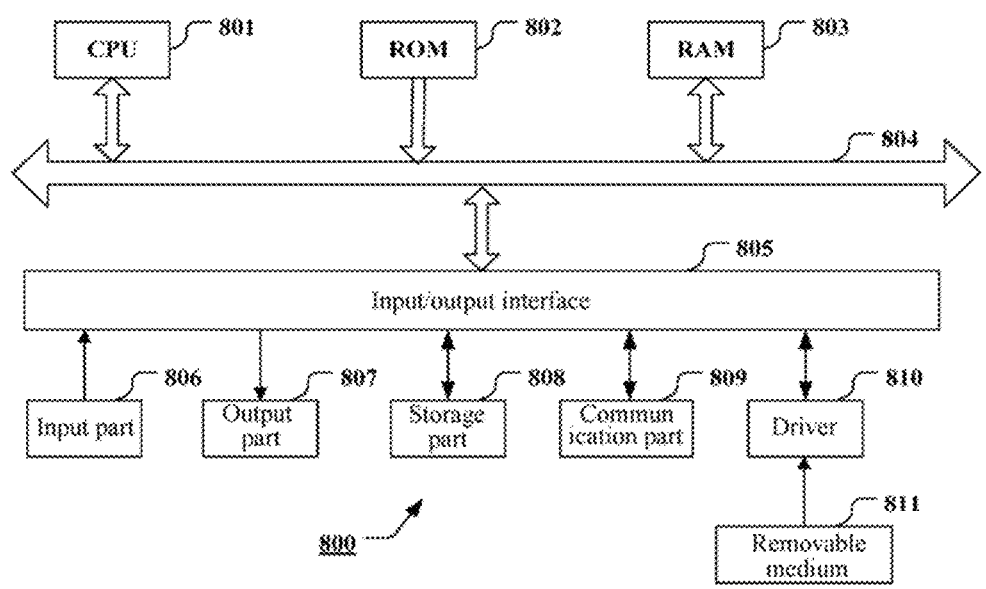
FIG. 8 is a block diagram showing an exemplary structure of a computer which implements the method and the device according to the present disclosure.

As shown in FIG. 8, a central processing unit (CPU) 801 can perform various processes based on a program stored in a read-only memory (ROM) 802 or a program loaded in a random-access memory (RAM) 803 from a storage part 808. In RAM 803, data required when the CPU 801 performs various processes and the like are also stored as needed. The CPU 801, the ROM 802, and the RAM 803 are connected to each other via a bus 804. An input/output (I/O) interface 805 is also connected to the bus 804.

The components connected to the I/O interface 805 include: an input part 806 (including a keyboard, and a mouse, etc.), an output part 807 (including a display such as a cathode ray tube (CRT), a liquid crystal display (LCD), and a speaker, etc.), a storage part 808 (including a hard disk, etc.), and a communication part 809 (including a network interface card such as LAN card, and a modem, etc.). The communication part 809 performs a communication processing via a network such as the Internet. A driver 810 may also be connected to the I/O interface 805 as required. A removable medium 811, such as a magnetic disk, an optical disk, a magneto-optical disk, and a semiconductor memory and the like, is mounted on the driver 810 as required, so that a computer program read from the removable medium 811 is stored in the storage part 808 as required.

In a case that the above series of processes are implemented by software, the program constituting the software is installed from a network such as Internet or a storage medium such as the removable medium 811.

Those skilled in the art should understand that, this storage medium is not limit to the removable medium 811 having the program stored therein as shown in FIG. 8, which is delivered separately from the apparatus for providing the program to the user. Examples of the removable medium 811 include a magnetic disk (including a floppy disk (registered trademark)), an optical disk (including a compact disk-read only memory (CD-ROM) and a digital versatile disk (DVD)), a magneto-optical disk (including a mini-disk (MD) (registered trademark)), and a semiconductor memory. Alternatively, the storage medium can be the ROM

802, the hard disk included in the storage port 808 and the like, which have the program stored therein and is delivered to the user together with the device that containing them.

According to an embodiment of the present disclosure, a program product in which machine readable instruction codes are stored is further provided. The instruction codes, when being read and executed by a machine, can perform the method according to the above embodiments of the present disclosure.

In an embodiment, a storage media for carrying the above program product in which machine readable instruction codes are stored, is further provided. The storage medium includes, but is not limited to, a floppy disk, an optical disk, a magneto-optical disk, a memory card, and a memory stick, etc.

In the above description of the specific embodiments of the present disclosure, features, that are described and/or illustrated with respect to one embodiment, may be used in the same way or in a similar way in one or more other embodiments or in combination with or instead of the features of the other embodiments.

It should be emphasized that the terms "including/comprising" is used to mean the presence of a feature, element, step or component, but does not exclude the presence or addition of one or more other features, elements, steps or components.

In the above embodiments and examples, numbered reference numerals are used to indicate various steps and/or units. It should be understood by those skilled in the art, that these reference numerals are only for convenience of description and drawing, and are not intended to represent the order or any other limitation.

Furthermore, the methods provided according to the present disclosure, are not limited to being performed in the chronological order described in the specification, and may be performed sequentially, in parallel or independently in other chronological order. Therefore, the order of execution of the methods described in the present specification does not limit the technical scope of the present disclosure.

Although the present disclosure has been disclosed above in the preferred embodiments, it should be understood that all the embodiments and examples described above are illustrative and not restrictive. Those skilled in the art can make various modifications, improvements or equivalents to the present disclosure within the spirit and scope of the appended claims. These modifications, improvements or equivalents also fall into the scope of the present disclosure.

(Appendix 1) A device for electromagnetic field simulation, comprising:

an electromagnetic field simulation section configured to obtain, with a first resolution, a first electromagnetic field simulation result of a simulation region; and a resolution improvement section configured to derive a second electromagnetic field simulation result with a second resolution, according to the first electromagnetic field simulation result, using a model trained based on a deep learning method, wherein the second resolution is higher than the first resolution. (1)

(Appendix 2) The device according to appendix 1, wherein the electromagnetic field simulation section is configured to obtain the first electromagnetic field simulation result using a finite difference time domain FDTD method. (2)

(Appendix 3) The device according to appendix 2, wherein the electromagnetic field simulation section is configured to calculate the first electromagnetic field simulation result based at least on an electromagnetic wave propagation frequency range in the simulation region, geometric parameters and material parameters of the simulation region, and mesh size. (3)

(Appendix 4) The device according to appendix 1, wherein the deep learning method includes a convolutional neural network method.

(Appendix 5) The device according to appendix 1, wherein the deep learning method comprises a super-resolution generative adversarial network SRGAN. (4)

(Appendix 6) The device according to appendix 1, wherein the first electromagnetic field simulation result and the second electromagnetic field simulation result comprise a four-dimensional data set, and the resolution improvement section is configured to convert the first electromagnetic field simulation result into the second electromagnetic field simulation result by:

decomposing the four-dimensional data set into a plurality of two-dimensional data sets;

for each of the plurality of two-dimensional data sets, improving a resolution of the two-dimensional data set using the model; and combining the plurality of two-dimensional data sets whose resolutions have been improved into a four-dimensional data set, as the second electromagnetic field simulation result. (5)

(Appendix 7) The device according to appendix 1, further comprising a model obtaining section configured to obtain the model by:

using the first electromagnetic field simulation result and the second electromagnetic field simulation result as training data, respectively; and deriving the model based on the training data using the deep learning method. (6)

(Appendix 8) The device according to appendix 7, wherein the model obtaining section is configured to: obtain an electromagnetic field simulation result of a simulation region as training data, using a finite difference time domain FDTD method, based on a first mesh size corresponding to a first resolution and a second mesh size corresponding to a second resolution, respectively.

(Appendix 9) The device according to appendix 7, wherein the deep learning method comprises a super-resolution generative adversarial network SRGAN, and the model obtaining section is configured to: obtain a generator network and a discriminator network of the SRGAN using the training data, and use the generator network as the model. (7)

(Appendix 10) The device according to appendix 1, wherein the model comprises a plurality of models, which are used for mapping between a plurality of the first resolutions and/or a plurality of the second resolutions, respectively. (8)

(Appendix 11) A method for electromagnetic field simulation, comprising:

obtaining, with a first resolution, a first electromagnetic field simulation result of a simulation region; and deriving a second electromagnetic field simulation result with a second resolution, according to the first electromagnetic field simulation result, using a model trained based on a deep learning method, wherein the second resolution is higher than the first resolution. (9)

(Appendix 12) The method according to appendix 11, wherein the first electromagnetic field simulation result is obtained using a finite difference time domain FDTD method.

(Appendix 13) The method according to appendix 12, wherein the first electromagnetic field simulation result is calculated based at least on an electromagnetic wave propagation frequency range in the simulation region, geometric parameters and material parameters of the simulation region, and mesh size.

(Appendix 14) The method according to appendix 11, wherein the deep learning method comprises a super-resolution generative adversarial network SRGAN.

(Appendix 15) The method according to appendix 11, wherein the first electromagnetic field simulation result and the second electromagnetic field simulation result comprise a four-dimensional data set, and the first electromagnetic field simulation result is converted into the second electromagnetic field simulation result by:

decomposing the four-dimensional data set into a plurality of two-dimensional data sets;

for each of the plurality of two-dimensional data sets, improving a resolution of the two-dimensional data set using the model; and combining the plurality of two-dimensional data sets whose resolutions have been improved into a four-dimensional data set, as the second electromagnetic field simulation result.

(Appendix 16) The method according to appendix 11, wherein the model is obtained by:

using the first electromagnetic field simulation result and the second electromagnetic field simulation result as training data, respectively; and deriving the model based on the training data using the deep learning method.

(Appendix 17) The method according to appendix 16, wherein an electromagnetic field simulation result of a simulation region is obtained as training data, using a finite difference time domain FDTD method, based on a first mesh size corresponding to a first resolution and a second mesh size corresponding to a second resolution, respectively.

(Appendix 18) The method according to appendix 16, wherein the deep learning method comprises a super-resolution generative adversarial network SRGAN, and a generator network and a discriminator network of the SRGAN are obtained using the training data, and the generator network is used as the model.

(Appendix 19) A device for training a model for electromagnetic field simulation, comprising:

a first simulation section configured to obtain, with a first resolution, a first electromagnetic field simulation result of a simulation region;

a second simulation section configured to obtain, with a second resolution, a second electromagnetic field simulation result of the simulation region, wherein the second resolution is higher than the first resolution; and a model deriving section configured to derive the model, using the first electromagnetic field simulation result and the second electromagnetic field simulation result as training data, using a deep learning method. (10)

(Appendix 20) A method for training a model for electromagnetic field simulation, comprising:

obtaining, with a first resolution, a first electromagnetic field simulation result of a simulation region;

obtaining, with a second resolution, a second electromagnetic field simulation result of the simulation region, wherein the second resolution is higher than the first resolution; and deriving the model, using the first electromagnetic field simulation result and the second electromagnetic field simulation result as training data, using a deep learning method.

The invention claimed is:

1. A device, comprising:
a processor to couple to a memory to,
obtain, with a first resolution, a first electromagnetic field simulation result of a simulation region; and
derive a second electromagnetic field simulation result with a second resolution higher than the first resolution, according to the first electromagnetic field simulation result, using a model trained based on a deep learning method,
wherein the first electromagnetic field simulation result and the second electromagnetic field simulation result comprise a four-dimensional data set, and
to derive the second electromagnetic filed simulation result, the processor is to convert the first electromagnetic field simulation result into the second electromagnetic filed simulation result by,
decomposing the four-dimensional data set into a plurality of two-dimensional data sets;
for each two-dimensional data set of the plurality of two-dimensional data sets, improving a resolution of the two-dimensional data set using the model; and
combining a plurality of the improved two-dimensional data sets, whose resolutions have been improved, into an improved four-dimensional data set, as the second electromagnetic filed simulation result with the second resolution.

2. The device according to claim 1, wherein the processor is to obtain the first electromagnetic field simulation result using a finite difference time domain (FDTD) method.

3. The device according to claim 2, wherein the processor is to calculate the first electromagnetic field simulation result based at least on an electromagnetic wave propagation frequency range in the simulation region, geometric parameters and material parameters of the simulation region, and a mesh size.

4. The device according to claim 1, wherein the deep learning method includes a convolutional neural network (CNN) method.

5. The device according to claim 1, wherein the deep learning method comprises a super-resolution generative adversarial network (SRGAN).

6. The device according to claim 1, wherein the processor is to obtain the model by:
initializing an electromagnetic field simulation by using the first electromagnetic field simulation result and the second electromagnetic field simulation result as training data, respectively; and
deriving the model based on the training data using the deep learning method.

7. The device according to claim 6, wherein to obtain the training data, the processor is to obtain the electromagnetic field simulation result of the simulation region using a finite difference time domain (FDTD) method, based on a first mesh size corresponding to the first resolution and a second mesh size corresponding to the second resolution, respectively.

8. The device according to claim 6, wherein the deep learning method comprises a super-resolution generative adversarial network (SRGAN), and to obtain the model the processor is to obtain a generator network and a discriminator network of the SRGAN using the training data, and use the generator network as the model.

9. The device according to claim 1, wherein the model comprises a plurality of models, which are used for mapping between a plurality of first resolutions and/or a plurality of second resolutions, respectively.

10. A method for electromagnetic field simulation, comprising:

by a processor that couples to a memory,
obtaining, with a first resolution, a first electromagnetic field simulation result of a simulation region; and
deriving a second electromagnetic field simulation result with a second resolution that is higher than the first resolution, according to the first electromagnetic field simulation result, using a model trained based on a deep learning method,
wherein the first electromagnetic field simulation result and the second electromagnetic field simulation result comprise a four-dimensional data set, and
the deriving the second electromagnetic filed simulation includes converting the first electromagnetic field simulation result into the second electromagnetic filed simulation result by,
decomposing the four-dimensional data set into a plurality of two-dimensional data sets;
for each two-dimensional data set of the plurality of two-dimensional data sets, improving a resolution of the two-dimensional data set using the model; and
combining a plurality of the improved two-dimensional data sets, whose resolutions have been improved, into an improved four-dimensional data set, as the second electromagnetic filed simulation result with the second resolution.

11. The method according to claim 10, wherein the first electromagnetic field simulation result is obtained using a finite difference time domain (FDTD) method.

12. The method according to claim 11, wherein the first electromagnetic field simulation result is calculated based at least on an electromagnetic wave propagation frequency range in the simulation region, geometric parameters and material parameters of the simulation region, and a mesh size.

13. The method according to claim 10, wherein the deep learning method comprises a super-resolution generative adversarial network (SRGAN).

14. The method according to claim 10, wherein the model is obtained by:
initializing the electromagnetic field simulation by using the first electromagnetic field simulation result and the second electromagnetic field simulation result as training data, respectively; and
deriving the model based on the training data using the deep learning method.

15. The method according to claim 14, wherein to obtain the training data, the electromagnetic field simulation result of the simulation region is obtained using a finite difference time domain (FDTD) method, based on a first mesh size corresponding to the first resolution and a second mesh size corresponding to the second resolution, respectively.

16. The method according to claim 14, wherein the deep learning method comprises a super-resolution generative adversarial network (SRGAN), and a generator network and a discriminator network of the SRGAN are obtained using the training data, and the generator network is used as the model.

\* \* \* \* \*